(12) United States Patent
Hasnain et al.

(10) Patent No.: US 8,338,848 B2
(45) Date of Patent: Dec. 25, 2012

(54) LED STRUCTURE

(75) Inventors: Ghulam Hasnain, Palo Alto, CA (US); Steven D. Lester, Palo Alto, CA (US)

(73) Assignee: Bridgelux, Inc., Livermore, CA (US)

(*) Notice: Subject to any disclaimer, the term of this patent is extended or adjusted under 35 U.S.C. 154(b) by 0 days.

(21) Appl. No.: 13/214,725

(22) Filed: Aug. 22, 2011

(65) Prior Publication Data
US 2011/0303942 A1    Dec. 15, 2011

Related U.S. Application Data

(63) Continuation of application No. 11/952,048, filed on Dec. 6, 2007, now Pat. No. 8,026,527.

(51) Int. Cl.
*H01L 33/46* (2010.01)
*H01L 33/52* (2010.01)
*H01L 33/60* (2010.01)

(52) U.S. Cl. ..... 257/98; 257/99; 257/100; 257/E33.067; 257/E33.068

(58) Field of Classification Search ............ 257/79–103, 257/E33.067, E33.068
See application file for complete search history.

(56) References Cited

U.S. PATENT DOCUMENTS

| | | | | |
|---|---|---|---|---|
| 6,420,735 B2 * | 7/2002 | Kim | | 257/95 |
| 2003/0222270 A1 * | 12/2003 | Uemura | | 257/99 |
| 2005/0056855 A1 * | 3/2005 | Lin et al. | | 257/98 |
| 2005/0279990 A1 * | 12/2005 | Liu et al. | | 257/13 |
| 2006/0081869 A1 * | 4/2006 | Lu et al. | | 257/99 |
| 2007/0102711 A1 * | 5/2007 | Aoyagi et al. | | 257/79 |
| 2007/0272930 A1 * | 11/2007 | Tseng et al. | | 257/79 |

* cited by examiner

*Primary Examiner* — Steven J Fulk
*Assistant Examiner* — Eric Ward
(74) *Attorney, Agent, or Firm* — Calvin B. Ward

(57) ABSTRACT

A light emitting device, a wafer for making the same, and method for fabricating the same are disclosed. The device and wafer include a first layer of a first conductivity type, an active layer, and a layer of a second conductivity type. The active layer overlies the first layer, the active layer generating light. The second layer overlies the active layer, the second layer having a first surface in contact adjacent to the active layer and a second surface having a surface that includes features that scatter light striking the second surface. A layer of transparent electrically conducting material is adjacent to the second surface and covered by a first layer of a dielectric material that is transparent to the light generated by the active layer. A mirror layer that has a reflectivity greater than 90 percent is deposited on the first layer of dielectric material.

2 Claims, 10 Drawing Sheets

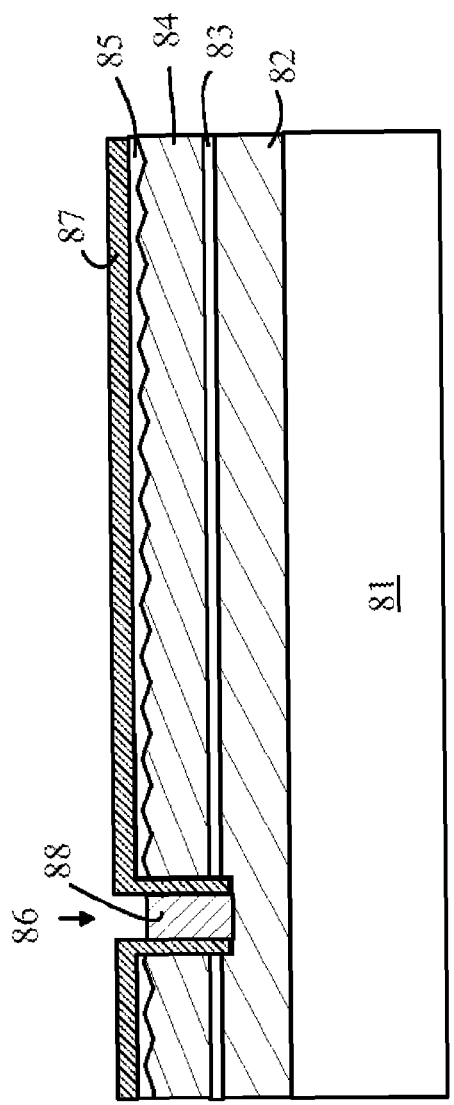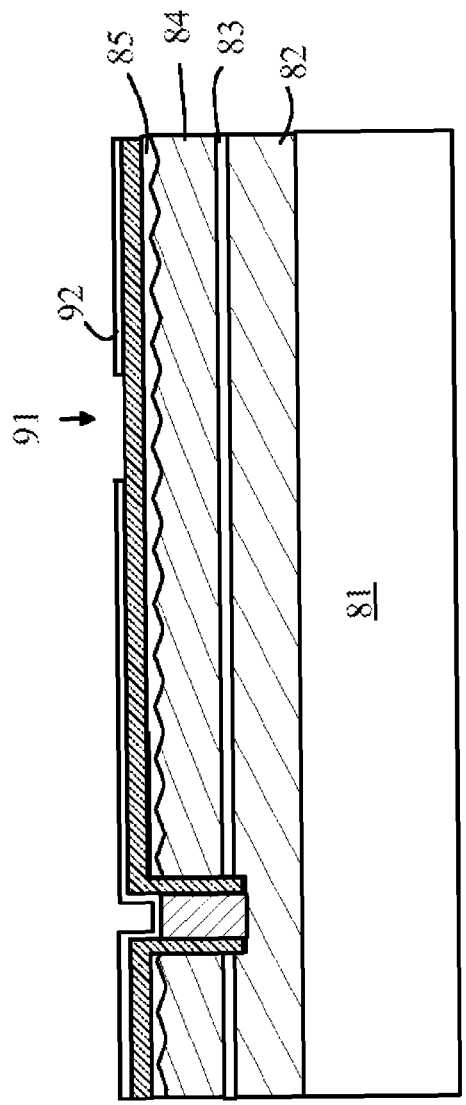

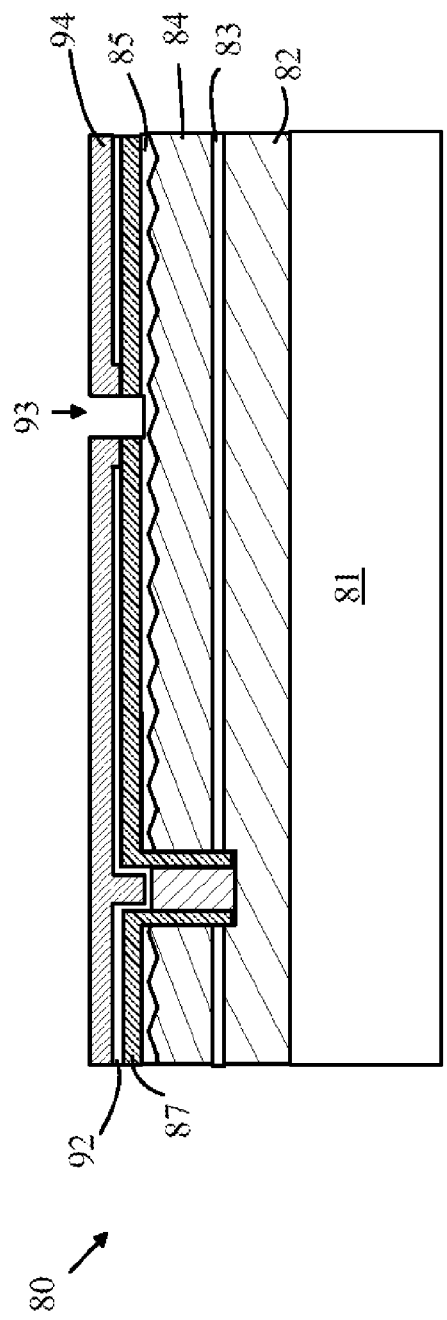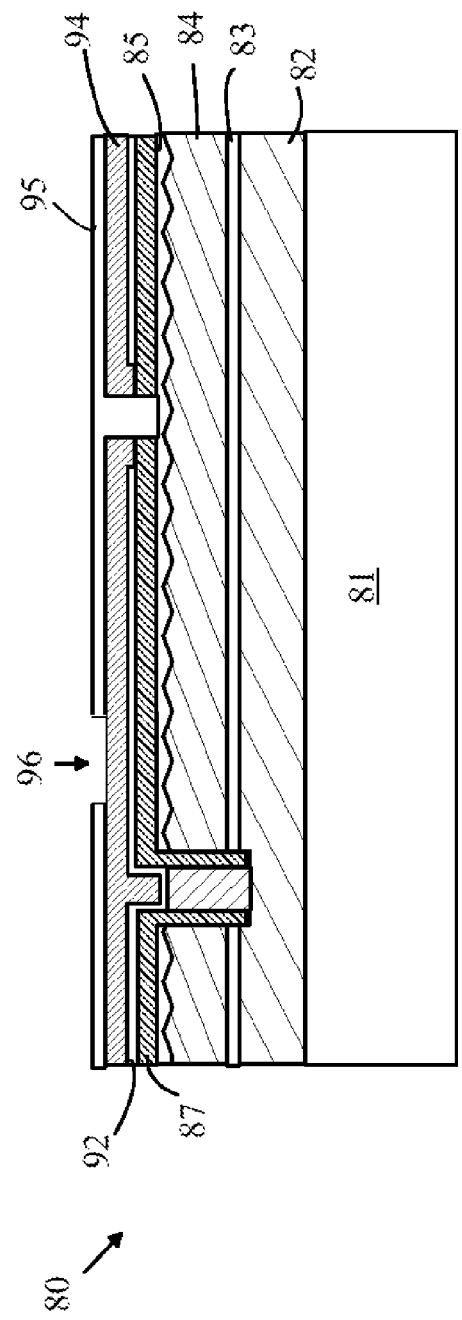

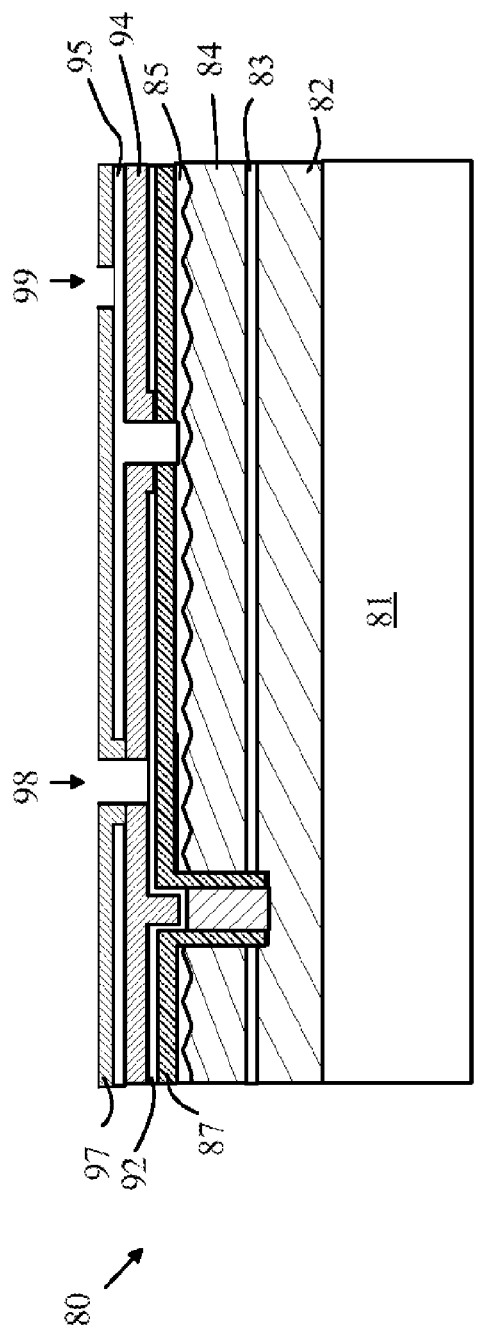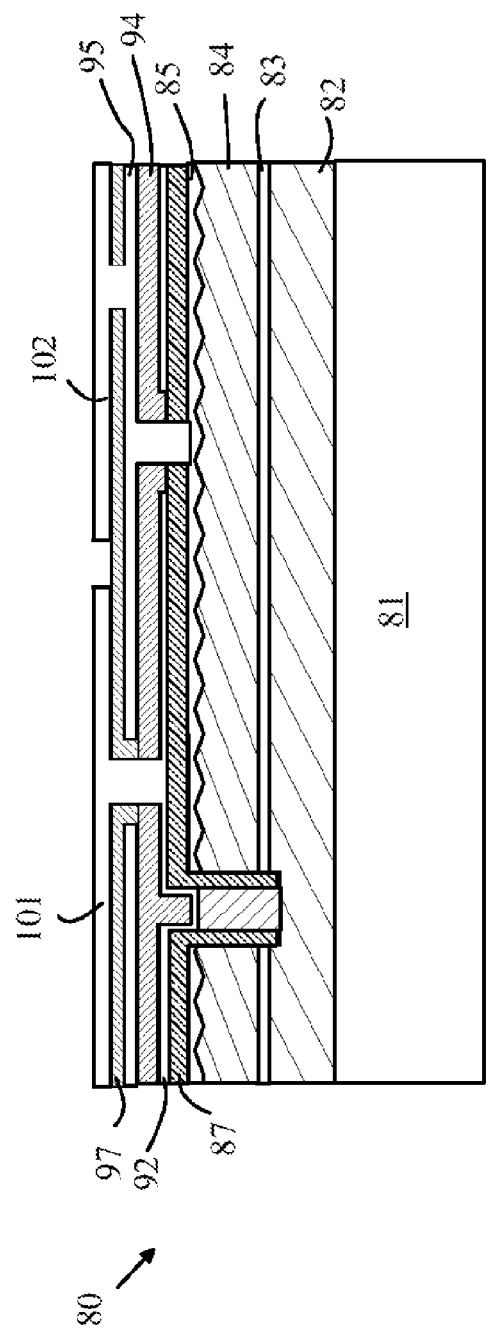

LED STRUCTURE

CROSS-REFERENCE TO RELATED APPLICATION(S)

This is a continuation under 35 U.S.C. 120 of application Ser. No. 11/952,048 filed on Dec. 6, 2007 which was issued on Sep. 27, 2011 as U.S. Pat. No. 8,026,527.

BACKGROUND OF THE INVENTION

Light emitting diodes (LEDs) are an important class of solid-state devices that convert electric energy to light. Improvements in these devices have resulted in their use in light fixtures designed to replace conventional incandescent and fluorescent light sources. The LEDs have significantly longer lifetimes and, in some cases, significantly higher efficiency for converting electric energy to light.

The cost and conversion efficiency of LEDs are important factors in determining the rate at which this new technology will replace conventional light sources and be utilized in high power applications. Many high power applications require multiple LEDs to achieve the needed power levels, since individual LEDs are limited to a few watts. In addition, LEDs generate light in relatively narrow spectral bands. Hence, in applications requiring a light source of a particular color, the light from a number of LEDs with spectral emission in different optical bands is combined. Thus, the cost of many light sources based on LEDs is many times the cost of the individual LEDs.

The cost of an LED is increased by the need to package the LED containing dies prior to installing those dies on printed circuit boards and the like in the final product. The cost of conventional packaging that relies on wire bonds to connect the dies to an underlying circuit carrier represents a significant fraction of the cost of the final LED. Hence, "flip-chip" packages in which the LED die is modified such that the pads for powering the LED are on the opposite side of the die from the surface through which the light is emitted have been developed. The pads are constructed such that the die can be soldered directly to a pair of corresponding pads on a printed circuit board. Unfortunately, the techniques used to increase the conversion efficiency of LEDs are not easily implemented in the flip-chip architecture.

The conversion efficiency of individual LEDs is an important factor in addressing the cost of high power LED light sources. Electrical power that is not converted to light in the LED is converted to heat that raises the temperature of the LED. Heat dissipation places a limit on the power level at which an LED operates. In addition, the LEDs must be mounted on structures that provide heat dissipation, which, in turn, further increases the cost of the light sources. Hence, if the conversion efficiency of an LED can be increased, the maximum amount of light that can be provided by a single LED can also be increased, and hence, reduce the number of LEDs needed for a given light source. In addition, the cost of operation of the LED is also inversely proportional to the conversion efficiency. Hence, there has been a great deal of work directed to improving the conversion efficiency of LEDs.

The spectral band generated by an LED, in general, depends on the materials from which the LED is made. LEDs commonly include an active layer of semiconductor material sandwiched between additional layers. For the purposes of this discussion, an LED can be viewed as having three layers, the active layer sandwiched between two other layers. These layers are typically deposited on a substrate such as sapphire. It should be noted that each of these layers typically includes a number of sub-layers.

Improvements in materials have led to improvements in the efficiency of light generated in the active layer. However, a significant fraction of the light generated in the active layer is lost. Most of this light is lost through absorption in the various layers used to construct the LED. This mode of light loss is aggravated by the trapping of much of the light within the LED structure. Light that is generated in the active layer must pass through the top layer or the substrate before exiting the LED. Since the active layer emits light in all directions, the light from the active region strikes the boundary between the outer layers of the LED at essentially all angles from 0 to 90 degrees relative to the normal direction at the boundary. Light that strikes the boundary at angles that are greater than the critical angle is totally reflected at the boundary. This light is redirected toward the other outer boundary and is likewise reflected back into the LED. As a result, the light is trapped within the LED until it strikes the end of the LED or is absorbed by the material in the LED. In the case of conventional GaN-based LEDs on sapphire substrates approximately 70 percent of the light emitted by the active layer is trapped between the sapphire substrate and the outer surface of the GaN.

Several techniques have been described to improve light extraction from LEDs, and hence, improve the light conversion efficiency of these devices. In one class of techniques, one of the outer surfaces of the LED is converted from a smooth planar surface to a rough surface. Some of the light that is reflected at the other surface will return to the rough surface at a location in which that light is now within the critical angle, and hence, escapes rather than being again reflected. The remainder of the light is reflected back toward the smooth surface and returns to the rough surface at a new location and at a range of angles, and hence, a portion of that light also escapes, and so on.

In a typical flip-chip LED, the light is emitted through the bottom surface of the LED, i.e., through the substrate on which the LED layers were deposited. Providing a rough surface at the substrate air boundary is not as effective in reducing the trapping of light within the high index GaN layers sandwiched between air and sapphire. Accordingly, the rough surface is normally provided on the top surface of the LED, unless it is applied to the bottom surface of the GaN by growing GaN on a surface-patterned sapphire substrate. However, in a flip-chip design, the top surface of the LED must also be a reflector. To convert the rough surface to a reflector, a layer of metal such as silver is applied to the surface. Unfortunately, the reflectivity of such a layer is substantially less than 100 percent due to surface plasmon effects caused by the underlying roughened layer.

To avoid this problem, prior art devices in which the substrate is removed to expose the bottom layer of epitaxially grown GaN are utilized. The LED is first bonded to a new substrate, the sapphire substrate is removed and the bottom surface is then roughened. However, this technique has its own problems. First, the substrate removal process is not as well developed as the other types of processing used to fabricate LEDs. Second, the process involves a number of additional steps that increase the cost of the LEDs. Finally, if during any period of time the LED wafer is without a substrate, the wafer is extremely fragile, and hence, subject to damage.

SUMMARY OF THE INVENTION

The present invention includes a light emitting device, a wafer for making the same, and a method for fabricating the same. The device and wafer include a first layer including a material of a first conductivity type, an active layer, and a layer including a material of a second conductivity type. The active layer overlies the first layer, the active layer generating light when holes and electrons recombine therein. The second layer overlies the active layer, the second layer having a first surface in contact adjacent to the active layer and a second surface having a surface that includes features that scatter light striking the second surface. A layer of transparent electrically conducting material is adjacent to the second surface and covered by a first layer of a dielectric material that is transparent to the light generated by the active layer. A mirror layer that has a reflectivity greater than 90 percent is deposited on the first layer of dielectric material. In one aspect of the invention, the mirror layer is connected to one of the first layer and the second layer by an electrically conducting via and a contact layer overlies the mirror layer, the contact layer being connected to the other of the first layer and the second layer by an electrically conducting via. In another aspect of the invention, the mirror layer and contact layer are connected to pads on the top surface of the device that are utilized for connecting the device to a printed circuit board or the like.

BRIEF DESCRIPTION OF THE DRAWINGS

FIGS. 5-10 are cross-sectional views of a portion of a wafer 80 at various stages in the fabrication of LEDs according to one embodiment of the present invention.

DETAILED DESCRIPTION OF THE PREFERRED EMBODIMENTS OF THE INVENTION

Figure 1:
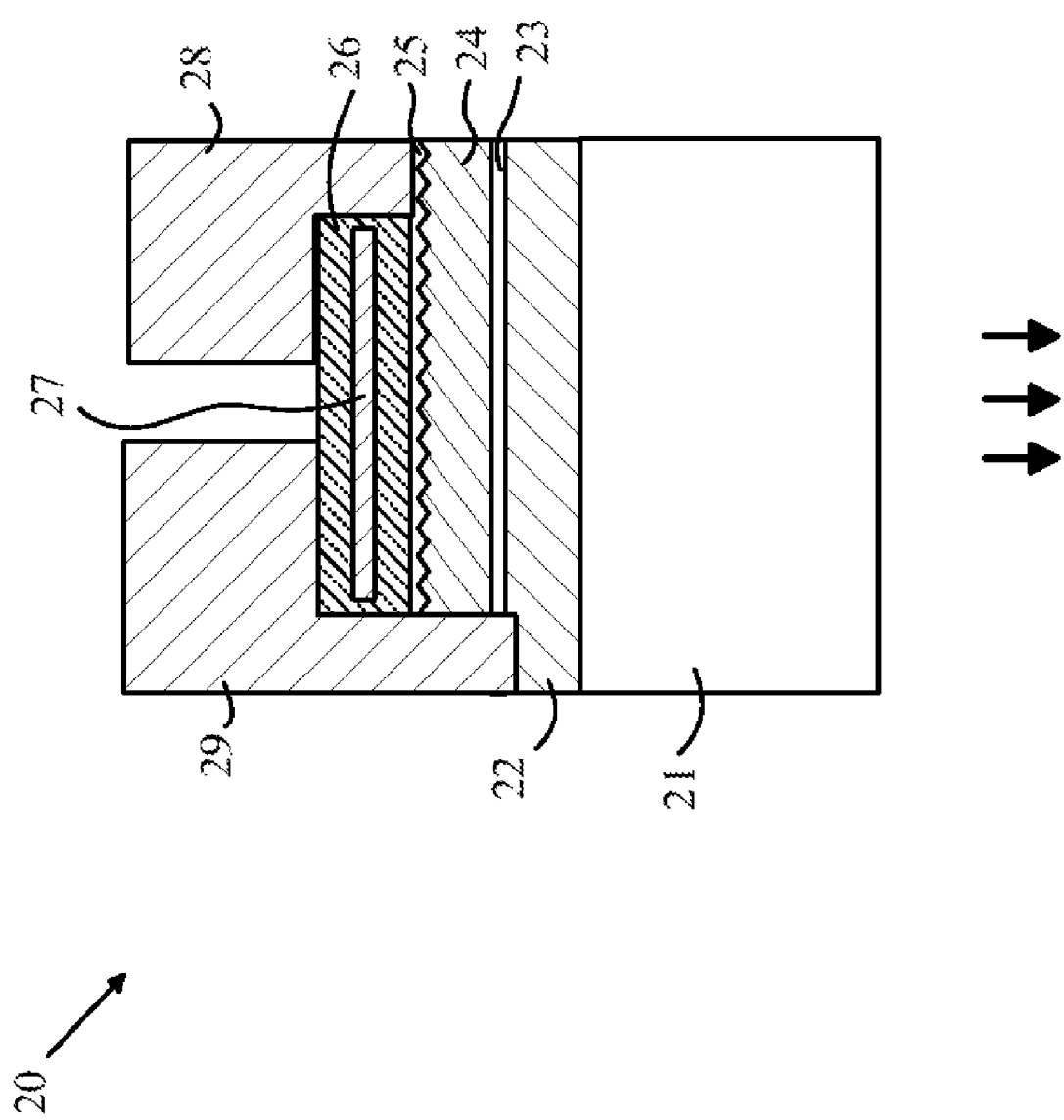
FIG. 1 is cross-sectional view of an LED according to one embodiment of the present invention.

The manner in which the present invention provides its advantages can be more easily understood with reference to FIG. 1, which is cross-sectional view of an LED according to one embodiment of the present invention. LED 20 is constructed on a sapphire substrate 21 by epitaxially growing a number of layers of GaN family materials. To simplify the following discussion, the layers may be grouped into three layers: An n-type layer 22, an active layer 23, and a p-type layer 24. It is to be understood, however, that each of these layers may include a number of sub-layers that vary in composition with respect to one another. In addition, it should be noted that the layers are not drawn to scale.

Active layer 23 generates light when holes and electrons from the adjacent layers combine therein. Active layer 23 can be constructed from multiple InGaN layers separated by GaN layers. The precise details of the active region are known to the art, and hence, will not be discussed in detail here.

The upper surface of p-layer 24 is roughened by a suitable etching procedure after the layer has been deposited or by appropriate changes in the crystal growth conditions during the last part of the growth. Methods for roughening the p-layer are also known to the art, and hence, will not be discussed in detail here. Wafers having layers 22-24 on substrate 21 with layer 24 already roughened can be provided by various semiconductor foundries.

A transparent electrically conducting layer 25 is deposited on the roughened surface of p-layer 24. Indium tin oxide (ITO) can be used to construct layer 25. Layer 25 acts as a current spreading layer. The resistance of p-layer 24 is too great to allow the current to be evenly distributed over the active layer when a potential is applied to one side of p-layer 24. Hence, layer 25 is introduced to provide an optically transparent contact that covers the surface of p-layer 24.

Light striking the roughened surface of layer 24 is either scattered back toward substrate 21 or transmitted by the surface. The light that is transmitted by the surface is reflected back through layer 24 by a mirror layer 27 that is encapsulated in a dielectric layer 26. The mirror layer can be constructed from silver or aluminum which have the highest reflectance in the blue over the widest range of incident angles. The dielectric encapsulant can be constructed from two layers of spin-on glass (SOG) or other common dielectrics such as SiOx or SiNx. The first layer is deposited on the wafer and provides a smooth top surface on which the silver is deposited. The smoothness of the surface on which the mirror is deposited is critical to the performance of the mirror. If the surface is rough, the reflectivity of the mirror will be significantly less than 90 percent in the blue (~450 nm). SOG is chosen for the first layer because it provides a sufficiently smooth surface and is optically transparent to the blue light generated in the active region. The mirror layer obtained with the SOG surface has a reflectivity greater than 90 percent. It should be noted that the ITO layer is not sufficiently smooth to allow the mirror to be deposited on the ITO and have the required reflectivity. If the mirror is deposited directly on the ITO layer, the mirror will have a reflectivity less than 70 percent. If other dielectric layers are utilized, the layers must be planarized to provide a reflectivity of greater than 90 percent. In this embodiment, the metal mirror layer is patterned such that the second layer of SOG or other dielectric encapsulates the metal mirror.

After the encapsulated mirror is constructed, the wafer is etched to provide vias that extend to layers 22 and 24. Metal electrodes 28 and 29 are then deposited over these vias to provide the connection pads for powering the LED. The top surfaces of electrodes 28 and 29 are approximately coplanar, and hence, LED 20 can be mounted on a printed circuit board by soldering the electrodes directly to corresponding pads on the printed circuit board.

The encapsulation discussed above serves two functions. First, it prevents the material from which the mirror is constructed from migrating. Metal migration is a significant problem if silver is used for the mirror material. Second, the encapsulant prevents the metal mirror layer from connecting electrodes 28 and 29, and hence, prevents the shorting of these electrodes.

Figure 2:
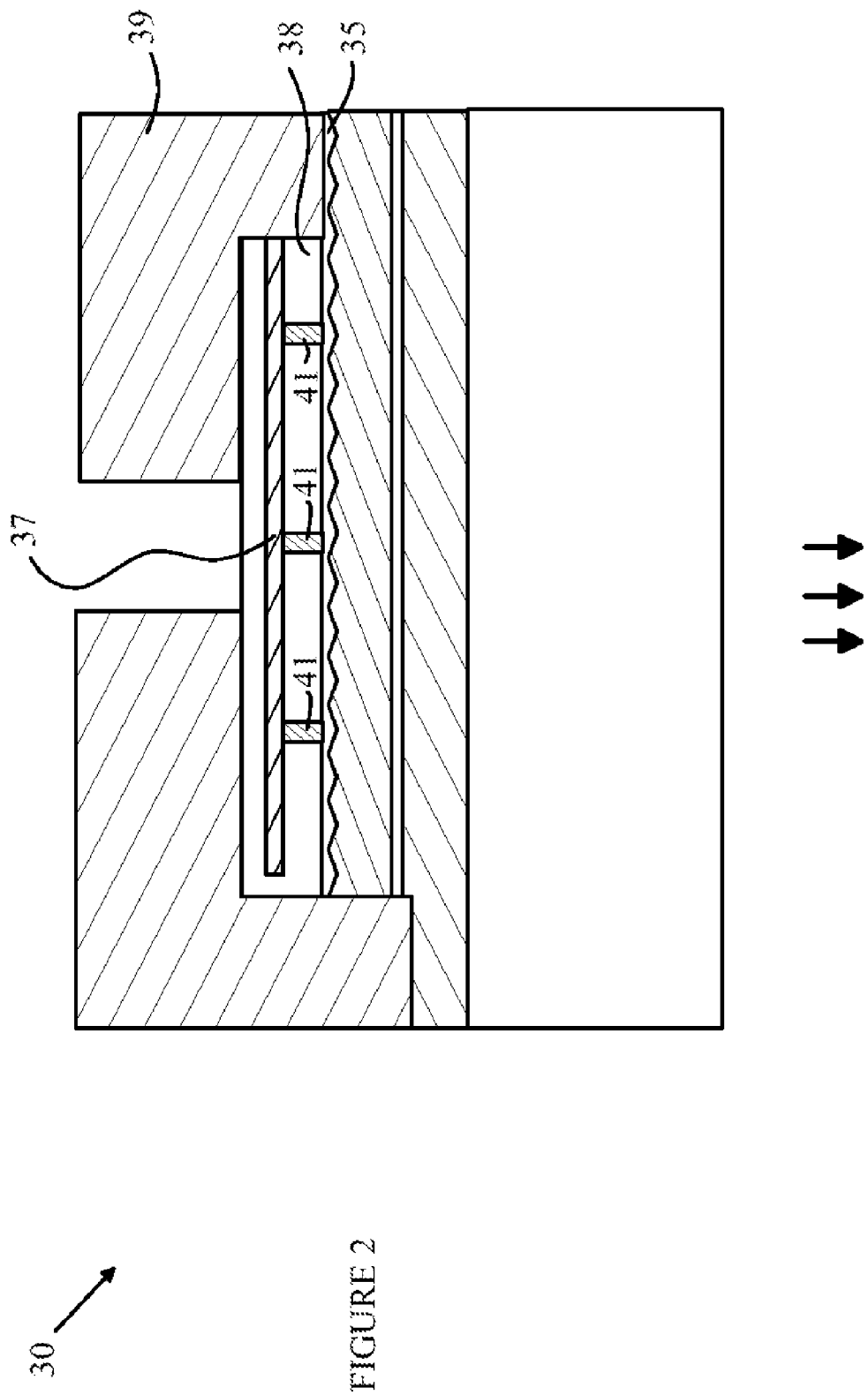
FIG. 2 is a cross-sectional view of another embodiment of an LED according to the present invention.

The above-described embodiments power the LED by applying the drive voltages at the ends of the ITO and n-GaN layers. However, in large area devices, the resistivity of the ITO and n-GaN layers becomes problematic at high currents. Hence, some additional form of current spreading is desirable in large area LEDs. In some prior art devices, relatively thick or tall yet narrow metal fingers are deposited on the ITO and in trenches that expose the n-GaN layer to facilitate current spreading. Such electrode fingers are costly to make, mechanically fragile and sometimes damaged during die handling. In one embodiment of the present invention, the mirror layer is also used as a current spreading layer. Refer now to FIG. 2, which is a cross-sectional view of another embodiment of an LED according to the present invention. LED 30 is similar to LED 20 discussed above in that a mirror layer 37 is formed on the planar surface of a dielectric layer 38 that has been deposited over an ITO layer 35. Unlike LED 20, mirror layer 37 is connected electrically to electrode 39 and to ITO layer 35 at a plurality of points over the surface of ITO layer 35. The connections between mirror layer 37 and ITO layer 35 are provided by a number of metal filled vias 41. Hence, mirror layer 37 acts as a current spreading electrode as well as a mirror. The density of metal filled vias depends on the resistivity of the underlying ITO layer and the thickness of that layer. The spacing of the vias is chosen such that the voltage drop along the ITO layer is less than a predetermined value that depends on the degree of uniformity required for the particular LED design. In one embodiment of the present invention, the spacing between the vias is between 100 and 200 μm.

Figure 3:
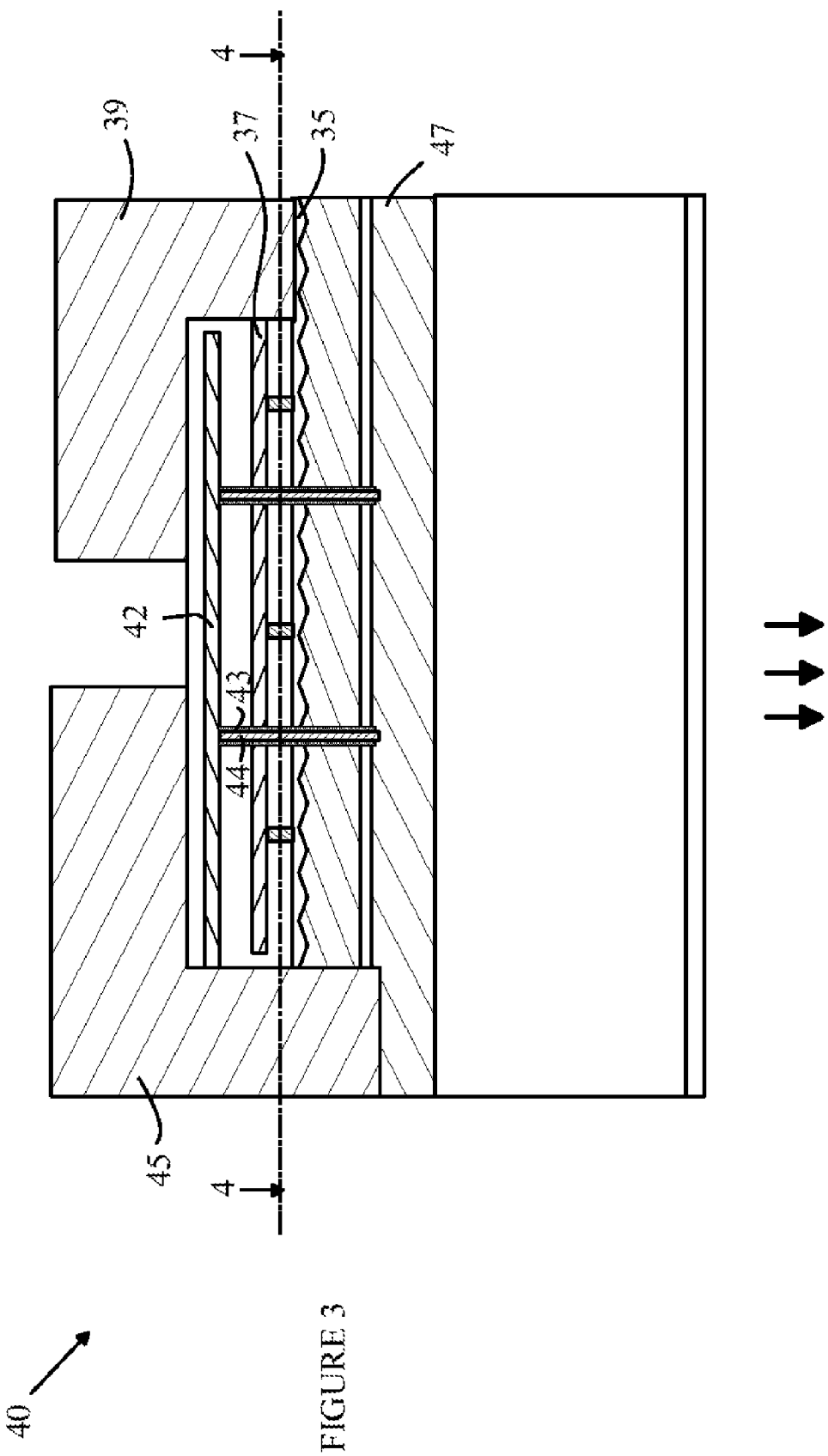
FIG. 3 is a cross-sectional view of another embodiment of an LED according to the present invention.

While the resistivity of the n-GaN material is significantly less than that of the p-type GaN material, current spreading problems also occur in the n-GaN layer if the device is sufficiently large. The current spreading in the n-GaN layer can be improved by utilizing a second metallic layer that is connected to the n-GaN layer by a plurality of metal filled vias. Refer now to FIG. 3, which is a cross-sectional view of another embodiment of an LED according to the present invention. LED 40 includes a second current spreading layer that provides contacts to the n-layer at a plurality of points. The current spreading layer includes a metal layer 42 that overlies mirror layer 37. Metal layer 42 is connected to an n-electrode 45. A plurality of insulated vias having a metal core 44 and an insulating outer layer 43 connect layer 42 to various locations in n-layer 47 so that the distance from a potential source to any point in n-layer 41 is less than a predetermined distance that depends on the design of LED 40.

Figure 4:
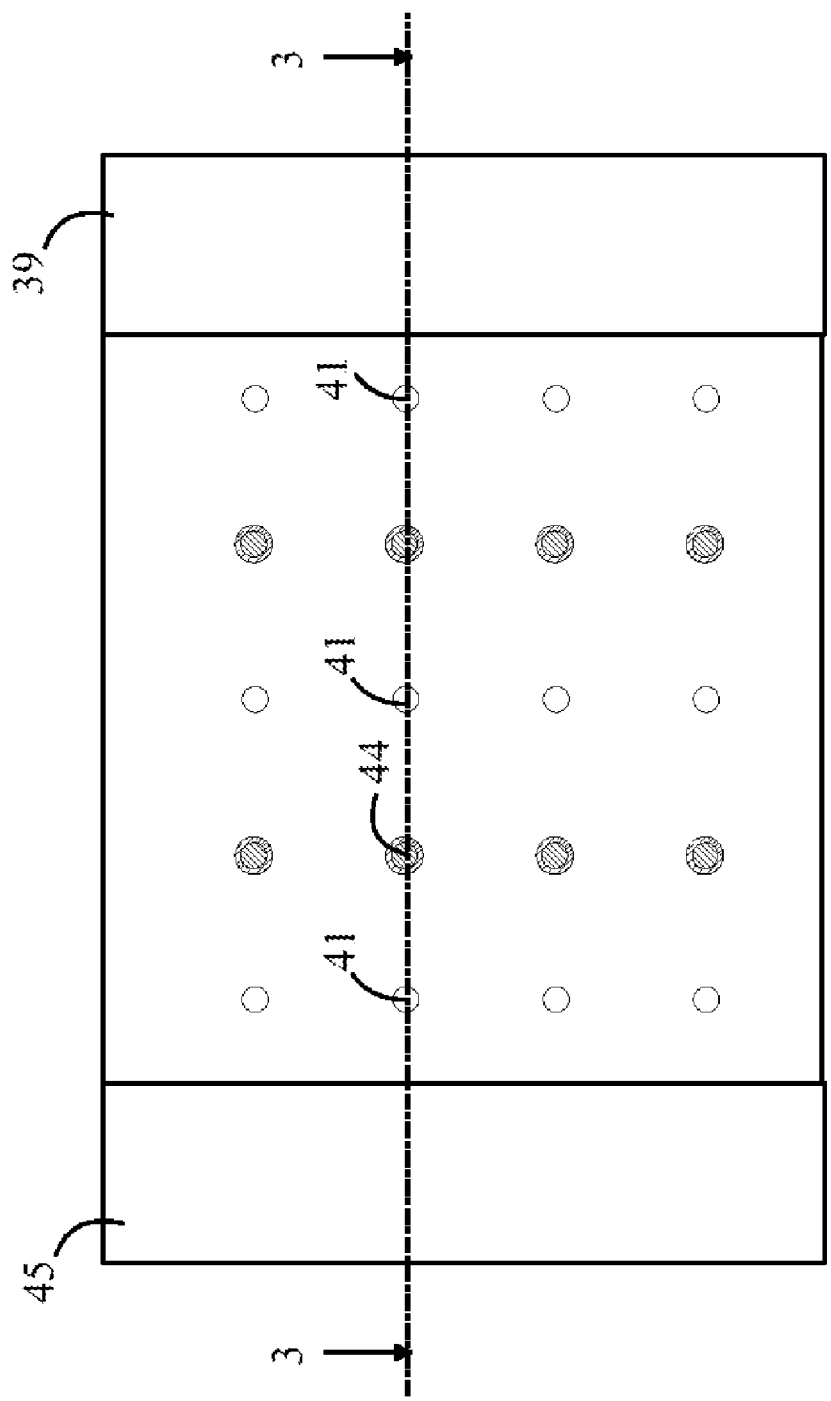
FIG. 4 is a top view of a section of LED 40 through line 4-4 shown in FIG. 3.

Refer now to FIG. 4, which is a top view of a section of LED 40 through line 4-4 shown in FIG. 3. For reference, FIG. 3 is the cross-sectional view through line 3-3 shown in FIG. 4. The diameters of the metal filled vias are determined by the amount of current that must pass through each via, the length of the vias, and the resistivity of the metal used to fill the vias.

Refer now to FIGS. 5-10, which are cross-sectional views of a portion of a wafer 80 at various stages in the fabrication of LEDs according to one embodiment of the present invention. The process starts with a wafer in which the n-type layer 82, active region 83, and p-type layer 84 have already been grown on a substrate 81 as shown in FIG. 5. The starting wafer also includes the roughened p-type surface and a layer of ITO 85. The vias for the n-type current spreading contacts are etched through the wafer as shown at 86. An insulating layer 87 is then deposited over the wafer and the sides of via 86 and the glass at the bottom of the vias is removed by etching. Finally, a metal layer 88 is deposited in via 86. Insulating layer 87 can be constructed from SOG or any other suitable insulator. In this embodiment, metal layer 88 is Cr/Au; however, other conductors such as Ti/Au, Cr/Pt/Au can be utilized.

Refer now to FIG. 6. After the n-vias have been filled, a mirror layer 92 is deposited over the surface of insulating layer 87. Mirror layer 92 is patterned to leave openings 91 therein for the p-type vias that will provide the p-type current spreading contacts to ITO layer 85. In this embodiment, mirror layer 92 is constructed from an Ag/Ti alloy to improve the bonding of the mirror layer to Cr/Au layer 88.

Refer now to FIG. 7. After the mirror layer has been deposited and patterned, an insulating layer 94 is deposited over the mirror layer. Vias such as via 93 are then opened in insulating layers 94 and 87 to expose the underlying ITO layer 85. Next, a second metal layer 95 is deposited over insulating layer 94 as shown in FIG. 8. The metal filled via 93 provide a contact to ITO layer 85.

Refer now to FIG. 8. Metal layer 95 is patterned to include an opening 96 that will be used to provide an insulated metal filled via that will connect metal layer 92 to a contact on the top surface of the final wafer. Next, an insulating layer 97 is deposited over metal layer 95 and vias 98 and 99 are opened to provide access to metal layers 92 and 95, respectively, as shown in FIG. 9. Finally, a metal layer is deposited over insulating layer 97 and patterned to provide electrodes 101 and 102 as shown in FIG. 10. Electrode 101 provides an external contact for powering the n-layer, and electrode 102 provides an external contact for powering the p-layer.

Figure 11:
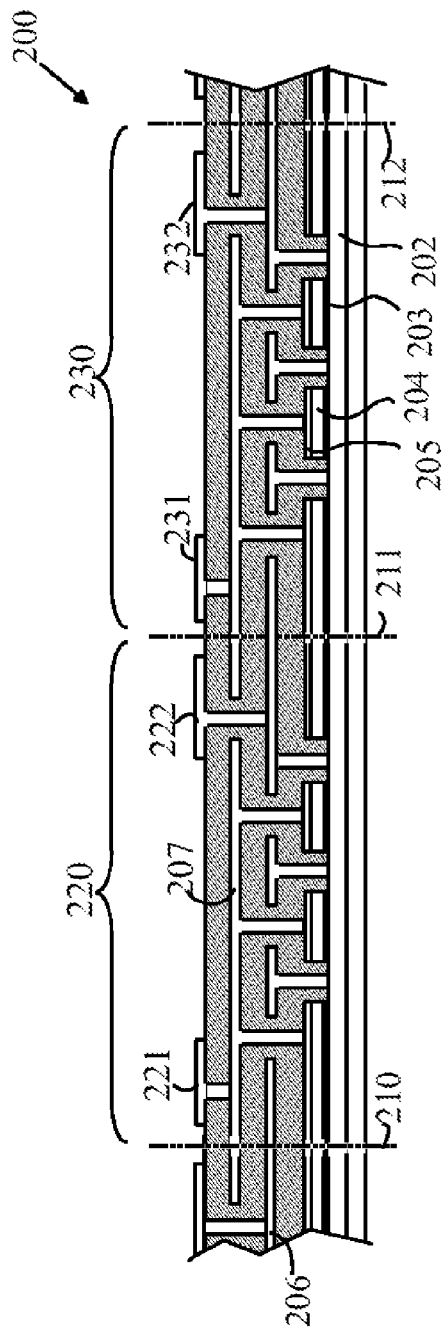
FIG. 11 illustrates the region of the wafer that would be divided into two dies as shown by dicing the wafer.

The above-described figures provided a cross-sectional view of a portion of a wafer that corresponded to part of a single die. To further clarify the wafer level structures, refer to FIGS. 11 and 12, which are cross-sectional views of a portion of a wafer that includes two dies after the steps discussed above with respect to FIGS. 5-10 have been completed. The portion of wafer 200 shown in FIG. 11 comprises the region of the wafer that would be divided into the two dies shown at 220 and 230 by dicing the wafer through lines 210-212. The various layers in the wafer are continuous across the wafer with the exception of the various vias discussed above and the top contacts. The top metal layer that connects to p-contact points is shown at 207, and the mirror layer that also provides the connections to the n-contact points is shown at 206. To simplify the drawing, the roughened surface between p-layer 204 and ITO layer 205 has been omitted. The active layer is shown at 203, and the n-layer is shown at 202.

Figure 12:
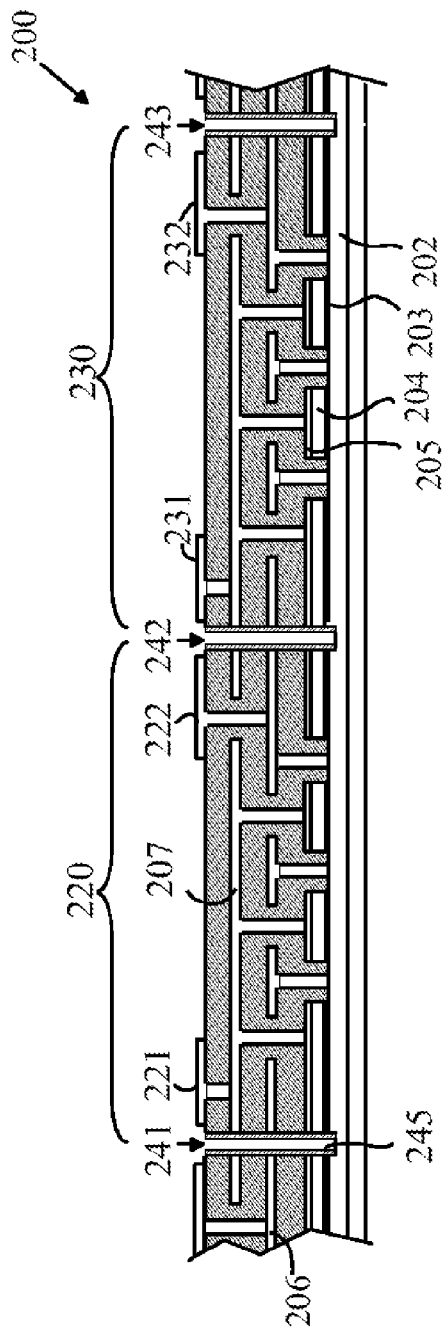
FIG. 12 illustrates wafer 200 according to one embodiment of the present invention.

Refer now to FIG. 12. Prior to dicing wafer 200, trenches are cut at the dice points as shown at 241-243. Each trench extends from the top surface of wafer 200 to a point below the active layer. An insulating material is deposited on the walls of the trenches as shown at 245. The insulating material is SiOx or SiNx in one embodiment of the present invention. The insulating layer seals the edge of the die to protect the active layer and p-layers from moisture so that the die can be directly bonded to a printed circuit board without further packaging. Pads 221 and 222 provide the flip-chip bond pads for die 220, and pads 231 and 232 provide the flip-chip bond pads for die 230.

It should be noted that the same wafer could be diced into larger dies by omitting one of the dicing points discussed above. For example, consider the case in which trench 242 is omitted and pads 222 and 231 are removed by using a different mask at that step. When the water is diced through trenches 241 and 243, a die having twice the width will be formed from the portion of the wafer that was originally diced to provide dies 220 and 230. The n-contact for this new die will be pad 221 and the p-contact for the new die will be pad 232. Hence, the same wafer can be used to make dies of a variety of sizes by altering the masks used in the trenching operation. Accordingly, a manufacturer need only stock one wafer, and hence, the time needed to change die sizes is substantially reduced.

Figure 13:
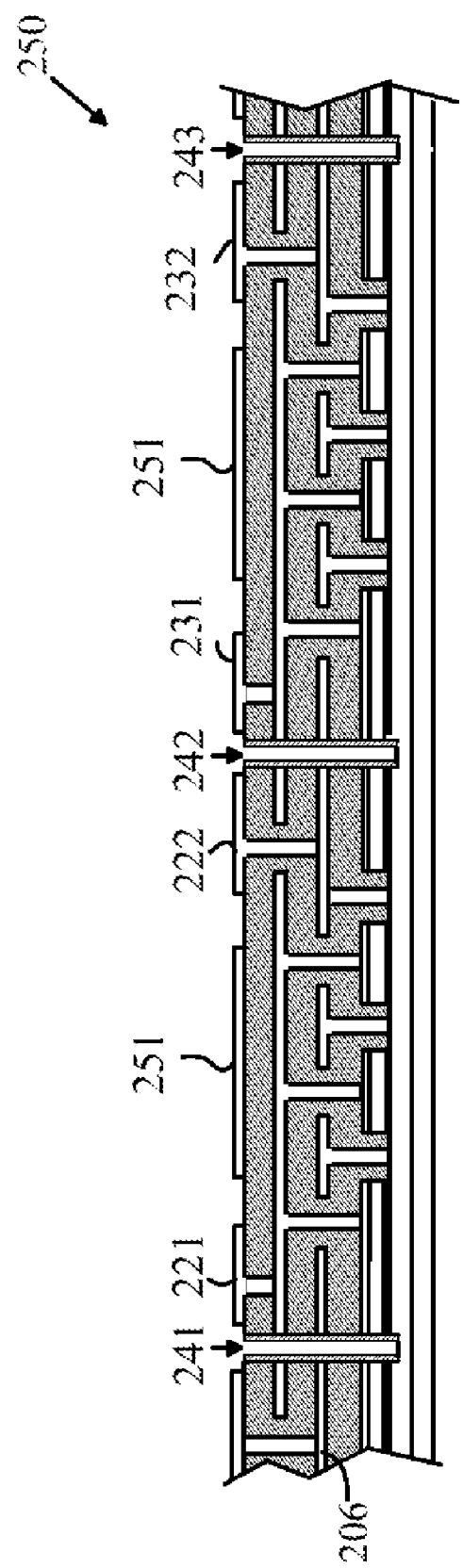
FIG. 13 is a cross-sectional view of a portion of a wafer according to another embodiment of the present invention.

Heat dissipation is a significant problem in high-powered LEDs. In one class of LED, the heat generated in the LEDs is transferred to the core of the printed circuit board to which the LEDs are attached. The heat is transferred either through pads that are connected to one of the power terminals of the LED or to pads that are in contact with the LED but insulated from the power terminals. The area of the pad that is connected to the core must be sufficient to ensure that the thermal resistance through the pad is not the limiting factor in moving heat from the LED to the core of the printed circuit board. In one embodiment of the present invention, a third pad is added to the top surface of the dies to provide heat transfer to a corresponding pad on the printed circuit board. Refer now to FIG. 13, which is a cross-sectional view of a portion of a wafer 250 that is similar to wafer 200 discussed above. The dies on wafer 250 include pads 251 that provide an insulated contact that can be used for transferring heat to a printed circuit board. If the heat conduction pad is to be one of the electrical power pads instead of an electrically isolated pad, that pad can be increased in size accordingly.

The above-described embodiments of the present invention utilize an LED configuration in which the n-type layer is deposited on the substrate and the p-type layer is deposited last. However, configurations in which the p-type layer is deposited on the substrate and the n-type layer is deposited last could also be constructed.

The above-described embodiments utilize the GaN family of materials. For the purposes of this discussion, the GaN family of materials is defined to be all alloy compositions of GaN, InN and AlN. However, it should be noted that the present invention could be practiced with other material systems.

Figure 14:
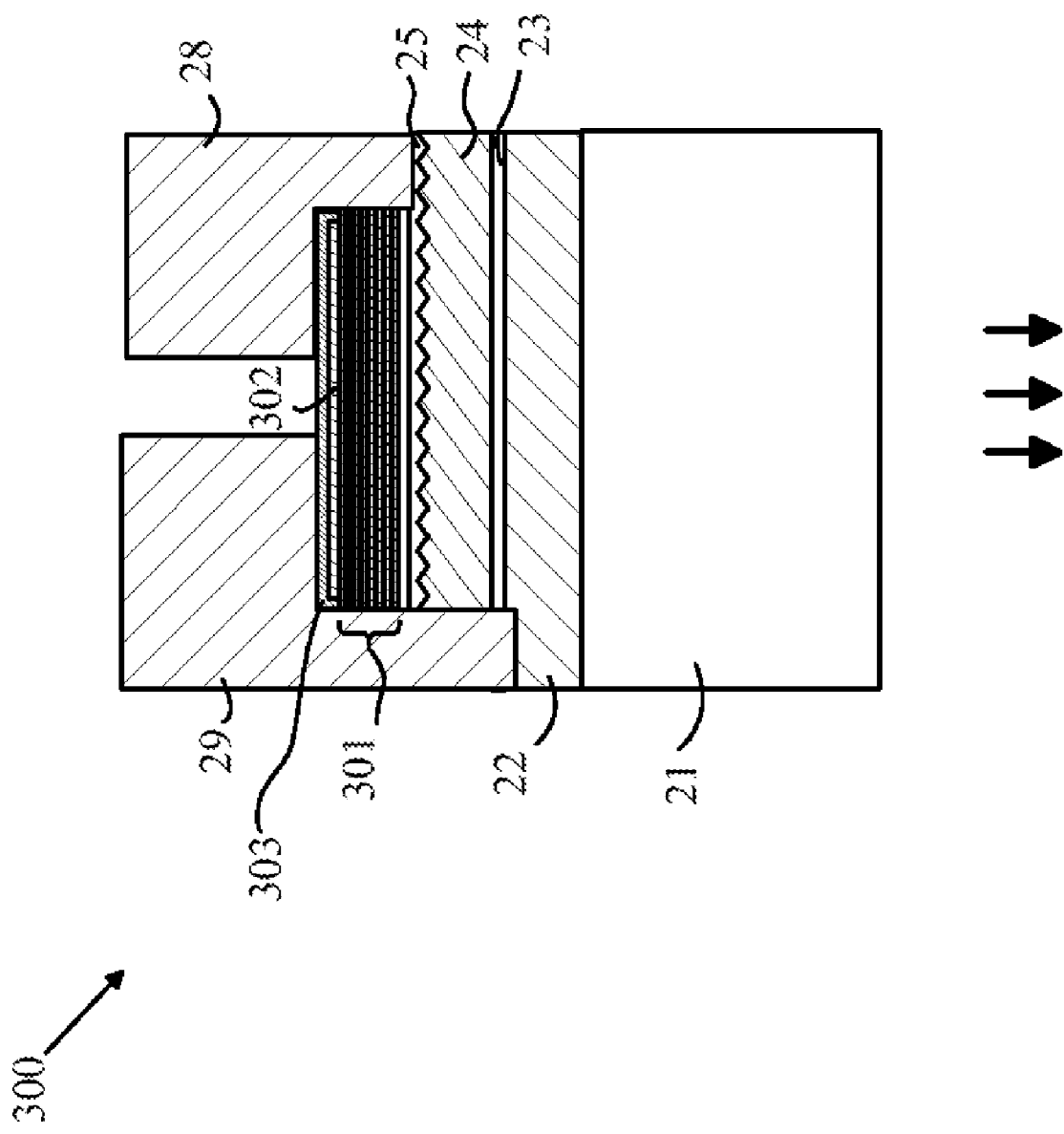
FIG. 14 is a cross-sectional view of an LED according to another embodiment of the present invention.

The above-described embodiments utilize a metal layer as the mirror. However, embodiments that utilize other forms of mirror can also be constructed. Refer now to FIG. 14, which illustrates an LED according to another embodiment of the present invention. LED 300 is similar to LED 20 discussed above with reference to FIG. 1, and hence, structures that perform functions analogous to those described above have been given the same numeric designations and will not be discussed in detail here. LED 300 differs from LED 20 in that the mirror layer has been replaced by a stack of dielectric layers 301 with alternating indices of refraction. The thickness of the layers and materials are chosen such that light of the wavelength generated in active layer 23 is constructively reflected from the boundaries of the various layers to form a mirror that is analogous to the mirrors used in VCSELs, such as distributed Bragg reflectors. A metallic layer 302 can optionally be included to further increase the reflectivity of the mirror for light that strikes stack 301 at angles that are significantly off axis. The metal layer can be encapsulated between the dielectric layers of stack 301 and a dielectric layer 303 to prevent electrodes 28 and 29 from being shorted.

The above-described embodiments of the present invention utilize layers that overlie another layer. For the purpose of this application, it is to be understood that a first layer that overlies a second layer may or may not be in direct contact with the second layer. Similarly, the above-described embodiments utilize layers of transparent material. For the purposes of this application, a layer will be defined as being transparent if the layer transmits light of the wavelength generated in the active layer with a transmittance of greater than 90 percent. A mirror layer is defined to be a layer that reflects light of the wavelength generated by the active layer with a reflectance of greater than 90 percent.

The above-described embodiments include a substrate on which the various layers are deposited during the fabrication of the devices. However, the substrate can be removed from the completed parts by bonding the wafer having the completed parts to a carrier and then removing the substrate by exposing the GaN-sapphire boundary to light of the appropriate wavelength. Removing the substrate provides advantages in some embodiments.

Various modifications to the present invention will become apparent to those skilled in the art from the foregoing description and accompanying drawings. Accordingly, the present invention is to be limited solely by the scope of the following claims.

What is claimed is:

1. A device comprising:
    a first layer comprising a material of a first conductivity type;
    an active layer overlying said first layer, said active layer generating light when holes and electrons recombine therein;
    a second layer comprising a material of a second conductivity type, said second layer having a first surface overlying said active layer and a rough surface opposite to said first surface comprising features that scatter light striking said rough surface;
    a layer of transparent electrically conducting material deposited on said rough second surface;
    a first layer of a dielectric material that is transparent to said light generated by said active layer, said first layer having a first surface in contact with said layer of transparent electrically conducting material and a second surface; and
    a reflective layer deposited on said second surface of said first dielectric layer, wherein said reflective layer has a reflectivity greater than 90%, and wherein said reflective layer would have a reflectivity less than 70% if deposited directly on said layer of transparent electrically conducting material;
    further comprising a second layer of a dielectric material overlying said reflective layer, said reflective layer being encapsulated by said first and second layers of dielectric material.

2. A device comprising:
    a first layer comprising a material of a first conductivity type;
    an active layer overlying said first layer, said active layer generating light when holes and electrons recombine therein;
    a second layer comprising a material of a second conductivity type, said second layer having a first surface overlying said active layer and a rough surface opposite to said first surface comprising features that scatter light striking said rough surface;
    a layer of transparent electrically conducting material deposited on said rough second surface;
    a first layer of a dielectric material that is transparent to said light generated by said active layer, said first layer having a first surface in contact with said layer of transparent electrically conducting material and a second surface; and
    a reflective layer deposited on said second surface of said first dielectric layer, wherein said reflective layer has a reflectivity greater than 90%, and wherein said reflective layer would have a reflectivity less than 70% if deposited directly on said layer of transparent electrically conducting material;
    wherein said reflective layer is connected to one of said first layer and said second layer by an electrically conducting via;
    further comprising a contact layer overlying said reflective layer, said contact layer being connected to the other of said first layer and said second layer by an electrically conducting via;
    wherein said electrically conducting via connecting said contact layer to the other of said first and second layers passes through an opening in said reflective layer.

* * * * *